(12) United States Patent
Zhao (10) Patent No.: US 11,935,900 B2
(45) Date of Patent: Mar. 19, 2024

(54) DISPLAY PANEL AND MANUFACTURING METHOD OF DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yingchun Zhao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 682 days.

(21) Appl. No.: 17/056,651

(22) PCT Filed: Oct. 15, 2020

(86) PCT No.: PCT/CN2020/121028
§ 371 (c)(1),
(2) Date: Nov. 18, 2020

(87) PCT Pub. No.: WO2022/047899
PCT Pub. Date: Mar. 10, 2022

(65) Prior Publication Data
US 2022/0310659 A1    Sep. 29, 2022

(30) Foreign Application Priority Data

Sep. 4, 2020    (CN) .......................... 202010921308.5

(51) Int. Cl.
*H01L 27/12*    (2006.01)
*C23C 16/06*    (2006.01)
(Continued)

(52) U.S. Cl.
CPC ........ *H01L 27/124* (2013.01); *H01L 27/1259* (2013.01); *C23C 16/06* (2013.01);
(Continued)

(58) Field of Classification Search
CPC ... H01L 27/124; H01L 27/1259; C23C 16/06; C23C 16/56; G02F 1/133345;
(Continued)

(56) References Cited

U.S. PATENT DOCUMENTS

2006/0139551 A1* 6/2006 Kimura ................. G02F 1/1345
349/149
2015/0040092 A1* 2/2015 Reber ................. H01L 23/5226
716/119
(Continued)

FOREIGN PATENT DOCUMENTS

CN    102799005 A    11/2012
CN    103309069 A    9/2013
(Continued)

OTHER PUBLICATIONS

International Search Report in International application No. PCT/CN2020/121028, dated May 26, 2021.
(Continued)

*Primary Examiner* — Herve-Louis Y Assouman
(74) *Attorney, Agent, or Firm* — PV IP PC; Wei Te Chung; Zhigang Ma (57) ABSTRACT

A display panel and a manufacturing method of a display panel are provided. The display panel includes a display area and a non-display area disposed on one side of the display area. A driving chip and a fanout wiring area are disposed in the non-display area. A fanout line module is disposed in the fanout wiring area. The fanout line module includes a first wiring area and a second wiring area. A first signal line connecting the data line is disposed in the first wiring area.
(Continued)

A second signal line connecting the gate line and another first signal line connecting the data line are disposed in the second wiring area.

20 Claims, 3 Drawing Sheets

(51) Int. Cl.
| | |
|---|---|
| *C23C 16/56* | (2006.01) |
| *G02F 1/1333* | (2006.01) |
| *G02F 1/1362* | (2006.01) |
| *G02F 1/1368* | (2006.01) |
| *H10K 59/131* | (2023.01) |

(52) U.S. Cl.
CPC ........ *C23C 16/56* (2013.01); *G02F 1/133345* (2013.01); *G02F 1/136295* (2021.01); *G02F 1/1368* (2013.01); *H10K 59/131* (2023.02)

(58) Field of Classification Search
CPC ............. G02F 1/136295; G02F 1/1368; G02F 1/1345; G02F 1/13452; G02F 1/1333; G02F 1/13454; G02F 1/136286; H10K 59/131; H10K 50/115; H10K 50/16
See application file for complete search history.

(56) References Cited

U.S. PATENT DOCUMENTS

| | | |
|---|---|---|
| 2016/0035307 A1 | 2/2016 | Jeon et al. |
| 2017/0023840 A1 | 1/2017 | Chen et al. |
| 2020/0150503 A1* | 5/2020 | He .................... G02F 1/13306 |
| 2020/0168639 A1* | 5/2020 | Yu .................... H01L 29/78633 |

FOREIGN PATENT DOCUMENTS

| | | |
|---|---|---|
| CN | 203241671 U | 10/2013 |
| CN | 103578443 A | 2/2014 |
| CN | 103635949 A | 3/2014 |
| CN | 104992952 A | 10/2015 |
| CN | 107170366 A | 9/2017 |
| CN | 206470722 U | 9/2017 |
| CN | 107490909 A | 12/2017 |
| CN | 109212852 A | 1/2019 |
| CN | 109360859 A | 2/2019 |
| CN | 110412802 A | 11/2019 |
| CN | 111554194 A | 8/2020 |
| WO | 2018225647 A1 | 12/2018 |

OTHER PUBLICATIONS

Written Opinion of the International Search Authority in International application No. PCT/CN2020/121028, dated May 26, 2021.
Chinese Office Action issued in corresponding Chinese Patent Application No. 202010921308.5 dated Apr. 8, 2021, pp. 1-8.
Chinese Office Action issued in corresponding Chinese Patent Application No. 202010921308.5 dated Jun. 4, 2021, pp. 1-8.
Notification to Grant Patent Right for Invention issued in corresponding Chinese Patent Application No. 202010921308.5 dated Jul. 21, 2021, pp. 1-4.

* cited by examiner

DISPLAY PANEL AND MANUFACTURING METHOD OF DISPLAY PANEL

RELATED APPLICATIONS

This application is a Notional Phase of PCT Patent Application No. PCT/CN2020/121028 having international filing date of Oct. 15, 2020, which claims the benefit of priority of Chinese Patent Application No. 202010921308.5 filed on Sep. 4, 2020. The contents of the above applications are all incorporated by reference as if fully set forth herein in their entirety.

FIELD OF DISCLOSURE

The present disclosure relates to the field of display technologies, and in particular to a display panel and a manufacturing method of a display panel.

BACKGROUND

Liquid crystal displays (LCDs) and organic light-emitting diodes (OLEDs) are currently two most widely used display technologies. In these two display devices, thin film transistors (TFTs) are widely used as display driving elements, which are directly related to display performance of the display devices.

The thin film transistors receive control signals and data signals from an outside through gate lines and data lines, and then transmit the data signals to display units to control a display function of the display units. The gate lines and the data lines are connected to a driving chip through transmission lines in a non-display area of the display device to receive the control signals and the data signals output by the driving chip. In the prior art, data signal transmission lines are disposed on an upper end of the display device, and control signal transmission lines are disposed on both sides of the display device. This design needs to reserve enough non-display area on at least three sides of the display device for an arrangement of the transmission lines, which causes a border of the display device to be too large and is not conducive to a realization of a narrow border design.

SUMMARY OF DISCLOSURE

In the prior art, data signal transmission lines are disposed on an upper end of a display device, and control signal transmission lines are disposed on both sides of the display device. This design needs to reserve enough non-display area on at least three sides of the display device for an arrangement of the transmission lines, which causes a border of the display device to be too large and is not conducive to a realization of a narrow border design.

In order to solve the above technical problems, technical solutions of the present disclosure are as follows.

The present disclosure provides a display panel, including a display area and a non-display area disposed on one side of the display area. A plurality of data lines and a plurality of gate lines are disposed in the display area, and a driving chip and a fanout wiring area are disposed in the non-display area.

At least one fanout line module is disposed in the fanout wiring area, the fanout line module includes a first wiring area and a second wiring area, a first signal line is disposed in the first wiring area, the first signal line electrically connects the driving chip and one of the data lines, a second signal line and another first signal line are disposed in the second wiring area, the second signal line electrically connects the driving chip and one of the gate lines, and the first signal line electrically connects the driving chip and one of the data lines.

In the display panel of the present disclosure, in the second wiring area, the first signal line and the second signal line are electrically insulated.

In the display panel of the present disclosure, the first signal line is disposed on a first metal layer, the second signal line is disposed on a second metal layer, and an insulating layer is disposed between the first metal layer and the second metal layer.

In the display panel of the present disclosure, the display panel further includes a substrate disposed on a bottom layer. In the second wiring area, the first signal line is disposed on the substrate.

In the display panel of the present disclosure, the display panel further includes a plurality of the first signal lines and a plurality of the second signal lines in the second wiring area. At least one of the second signal lines is parallel to at least one of the first signal lines.

In the display panel of the present disclosure, the first wiring area includes a first region and a second region, and the first region and the second region are respectively disposed on both sides of the second wiring area.

In the display panel of the present disclosure, widths of the first signal line and the second signal line are greater than or equal to 3 micrometers.

In the display panel of the present disclosure, in the first wiring area, a distance between two adjacent first signal lines is greater than or equal to 2.5 micrometers.

In the display panel of the present disclosure, in the second wiring area, the second signal line is disposed between two adjacent first signal lines, and a distance between the first signal line and the second signal line is greater than or equal to 2.5 micrometers.

The present disclosure also provides a manufacturing method of a display panel, including the following steps:

providing a substrate, where the substrate includes a display area and a non-display area disposed on one side of the display area;

forming a display unit, a gate line, and a data line in the display area of the substrate, where the gate line and the data line are electrically connected to the display unit; and forming a driving chip and a fanout line module in the non-display area of the substrate, where the fanout line module includes a first wiring area and a second wiring area, a first signal line is disposed in the first wiring area, the first signal line electrically connects the driving chip and the data line, a second signal line and another first signal line are disposed in the second wiring area, the second signal line electrically connects the driving chip and the gate line, and the first signal line electrically connects the driving chip and the data line.

In the manufacturing method of the display panel, a step of forming the fanout line module includes the following steps:

defining a first wiring area and a second wiring area in the non-display area of the substrate;

forming a first metal layer on the substrate in the first wiring area and the second wiring area;

patterning the first metal layer to form the first signal line;

forming an insulating layer covering the first signal line;

forming a second metal layer on the insulating layer in the second wiring area; and patterning the second metal layer to form the second signal line.

In the manufacturing method of the display panel, steps of patterning the first metal layer and patterning the second metal include the following steps:

inputting a minimum line width and a minimum line distance of the first signal line to be formed in the first wiring area into a computer, and inputting a minimum line width of the first signal line to be formed in the second wiring area, a minimum line width of the second signal line, and a minimum line distance between the first signal line and the adjacent second signal line into the computer;

calculating, by the computer, a position and a line width of the first signal line in the first wiring area, and positions and line widths of the first signal line and the second signal line in the second wiring area; and patterning the first metal layer and the second metal layer according to a calculation result of the computer.

In the manufacturing method of the display panel, a plurality of thin film transistors are disposed in the display area, the data line and the gate line are respectively electrically connected to a source and a gate of one of the thin film transistors, and a drain of the thin film transistor is electrically connected to the display unit.

In the manufacturing method of the display panel, the first wiring area includes a first region and a second region, and the first region and the second region are respectively disposed on both sides of the second wiring area.

In the manufacturing method of the display panel, a method of forming the first metal layer and the second metal layer includes a physical deposition method and a sputtering method.

In the manufacturing method of the display panel, a step of patterning the first metal layer includes exposure, development, and etching processes, and a step of patterning the second metal layer includes exposure, development, and etching processes.

In the manufacturing method of the display panel, the first signal line and the second signal line are electrically insulated.

In the manufacturing method of the display panel, widths of the first signal line and the second signal line are greater than or equal to 3 micrometers.

In the manufacturing method of the display panel, in the first wiring area, a distance between two adjacent first signal lines is greater than or equal to 2.5 micrometers. In the second wiring area, the second signal line is disposed between two adjacent first signal lines, and a distance between the first signal line and the second signal line is greater than or equal to 2.5 micrometers.

The present disclosure also provides a display panel, including a display area and a non-display area disposed on one side of the display area. A plurality of data lines and a plurality of gate lines are disposed in the display area, and a driving chip and a fanout wiring area are disposed in the non-display area.

At least one fanout line module is disposed in the fanout wiring area, the fanout line module includes a first wiring area and a second wiring area, a plurality of first signal lines are disposed in the first wiring area, the plurality of first signal lines electrically connect the driving chip and the data lines, a plurality of second signal lines and another plurality of first signal lines are disposed in the second wiring area, the second signal lines electrically connect the driving chip and the gate lines, the first signal lines electrically connect the driving chip and the data lines, the first signal lines and the second signal lines are electrically insulated.

Widths of the first signal lines and the second signal lines are greater than or equal to 3 micrometers.

In the first wiring area, a distance between two adjacent first signal lines is greater than or equal to 2.5 micrometers.

In the second wiring area, the second signal line is disposed between two adjacent first signal lines, and a distance between the first signal line and the second signal line is greater than or equal to 2.5 micrometers.

The display panel of the present disclosure includes the display area and the non-display area disposed on one side of the display area. The driving chip and the fanout wiring area are disposed in the non-display area. The first signal line connected to the data line and the second signal line connected to the gate line are disposed in the non-display area, which is beneficial to achieve narrow borders or no borders on three-side borders of the display panel.

BRIEF DESCRIPTION OF DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The description of the preferred embodiments refers to the accompanying drawings, so as to illustrate the specific embodiments of the present disclosure which can be carried out. Furthermore, directional terms described in the present disclosure, such as upper, lower, front, rear, left, right, inner, outer, side and etc., are only directions referring to the accompanying drawings, so that the used directional terms are used to describe and understand the present disclosure, but the present disclosure is not limited thereto. In the figures, the units with similar structures use the same numerals.

An embodiment of the present disclosure provides a display panel. The display panel includes a display area and a non-display area on one side of the display area. A driving chip and a fanout wiring area are disposed in the non-display area. A fanout line module in the fanout wiring area is divided, so there are only first signal lines in a first wiring area, and another first signal lines and second signal lines are disposed in the second wiring area. This zoning arrangement helps to ensure that a distance and a size of each signal line approach a design limit, thereby reducing a height of the fanout wiring area and achieving a narrow border.

Figure 1:
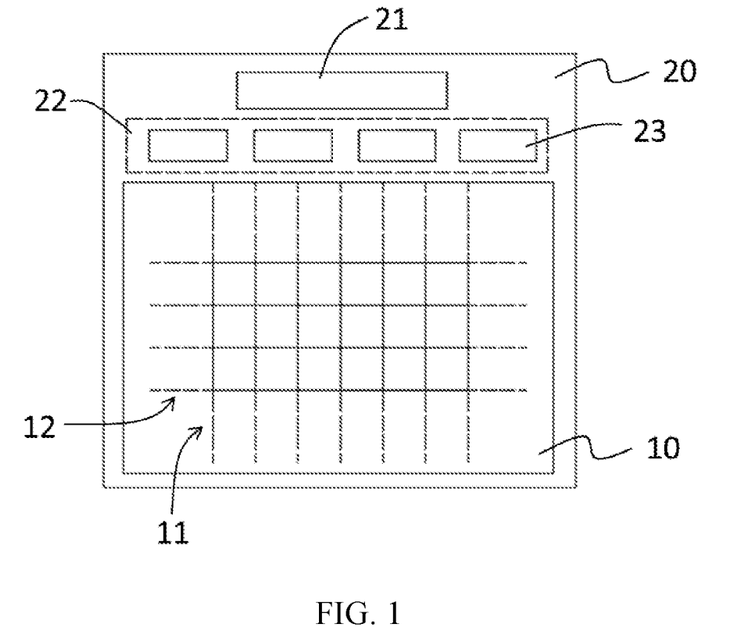
FIG. 1 is a schematic diagram of a display panel of an embodiment of the present disclosure.

FIG. 1 is a schematic diagram of a display panel of an embodiment of the present disclosure. The display panel includes a display area 10 and a non-display area 20 on one side of the display area 10. A plurality of data lines 11 and a plurality of gate lines 12 are disposed in the display area 10. A driving chip 21 and a fanout wiring area 23 are disposed in the non-display area 20. It should be noted that the display area 10 of the display panel is an area configured to display images in the display panel, and it can include various elements for realizing display functions, such as display units, pixel units, driving units, etc. The data lines 11 and gate lines 12 in the display area 10 are configured to provide data signals and control signals to the display units to realize a controllability of the images in the display. The non-display area 20 of the display panel is an area where peripheral wiring, components, and control chips are set, and it is configured to provide control signals, data signals, power, etc. for the display area. This area does not have a display function, and is usually set at an edge of the display panel, which determines a size of a border of the display panel. A fanout wiring area 22 is an area where lines connecting the display area 10 and the driving chip 21 are set. One end of the line in this area is connected to the large-sized display area 10, and the other end of the line is connected to the smaller-sized driving chip 21, thus forming a fan-shaped structure as a whole.

Figure 2:
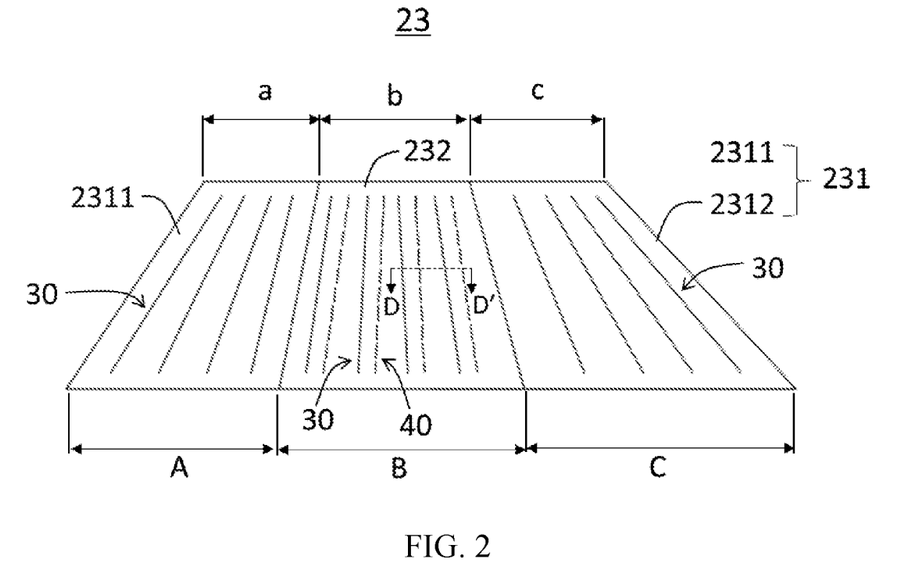
FIG. 2 is a schematic diagram of a fanout line module of FIG. 1.

Please refer to FIG. 1 and FIG. 2, where FIG. 2 is a schematic diagram of a fanout line module of FIG. 1. At least one fanout line module 23 is disposed in the fanout wiring area 22. The fanout line module 23 includes first wiring areas 231 and a second wiring area 232. The first wiring area 231 is provided with first signal lines 30 electrically connecting the driving chip 21 and the data lines 11. The second wiring area 232 is provided with second signal lines 40 electrically connecting the driving chip 21 and the gate lines 22 and another first signal lines 30 electrically connecting the driving chip 21 and the data lines 11. It should be understood that the driving chip 21 may be a source driving chip for providing data signals, a gate driving chip for providing control signals, or an integrated chip that provides both data signals and control signals. The driving chip 21 is connected to the first signal line 30 to provide data signals to the data lines 11. The driving chip 21 is connected to the second signal line 40 to provide control signals to the gate lines 22.

It should be noted that when manufacturing the fanout line module 23, it is necessary to use a computer to calculate position characteristics of each signal line in advance, and then the signal line is formed according to the calculation result. In this embodiment, the fanout line module 23 is divided into the first wiring area 231 and the second wiring area 232. Only the first signal lines 30 are provided in the first wiring area 231. The first signal lines 30 and the second signal lines 40 are together disposed in the second wiring area 232. Thus, when using the computer to calculate the position of each signal line, a size characteristic of the first wiring area 231, a size characteristic of the second wiring area 232, a line width and a line distance of the first signal line 30 in the first wiring area 231, line widths and line distances of the first signal line 30 and the second signal line 40 in the second wiring area 232 are input into the computer, so that the position and size characteristics of each signal line in the fanout line module 23 are refined. This is beneficial for the computer to accurately calculate the signal line setting information that is closer to the design limit, so that the final formed first signal line 30 and the second signal line 40 approach the design limit.

In the embodiment of the present disclosure, by disposing the first signal lines 30 connected to the data lines 11 and the second signal lines 40 connected to the gate lines 12 on the same side of the display area 10, it is beneficial to realize narrow borders or no border on other three sides of the display area 10. Also, the fanout line module 23 is divided, it facilitates an arrangement of the first signal lines 30 and the second signal lines 40 in a state approaching the design limit, further reducing the border of the display panel.

Alternatively, the first wiring area 231 includes a first region 2311 and a second region 2312. The first region 2311 and the second region 2312 are respectively arranged on both sides of the second wiring area 232. The first wiring area 231 is further subdivided into two regions arranged on both sides of the second wiring area 232, so that structural features of the first wiring area 231 are more refined. It is more conducive for the first signal lines 30 in the first wiring area 231 to approach the design limit and further reduce a border size.

Furthermore, in the fanout line module 23, a side close to the driving chip 21 is a short side, and a side close to the display area 10 is a long side. A length of the short side of the first region 2311 is "a," and a length of the long side is "A." A length of the short side of the second region 2312 is "c," and a length of the long side is "C." A length of the short side of the second wiring area 232 is "b," and a length of the long side is "C." The "a," "b," and "c" can be equal or unequal. The "A," "B," and "C" can be equal or unequal. It should be noted that the short side and long side sizes of each area are important parameters for the computer to calculate the signal line distribution characteristics.

Figure 3:
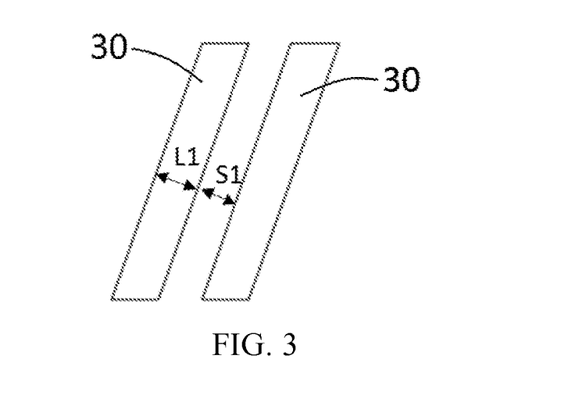
FIG. 3 is a schematic diagram of two adjacent first signal lines in a first wiring area.
Figure 4:
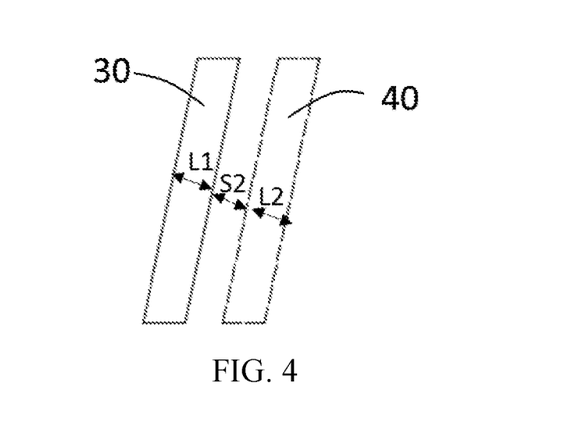
FIG. 4 is a schematic diagram of a first signal line and an adjacent second signal line in a second wiring area.

Referring to FIG. 1 to FIG. 4, where FIG. 3 is a schematic diagram of two adjacent first signal lines 30 in the first wiring area 231, and FIG. 4 is a schematic diagram of the first signal line 30 and the adjacent second signal line 40 in the second wiring area 232. A width L1 of the first signal line 30 is greater than or equal to 3 micrometers. A width L2 of the second signal line 40 is greater than or equal to 3 micrometers. In the first wiring area 231, a distance S1 between two adjacent first signal lines 30 is greater than or equal to 2.5 micrometers. In the second wiring area 232, the second signal line 40 is disposed between two adjacent first signal lines 30, and a distance S2 between the first signal line 30 and the adjacent second signal line 40 is greater than or equal to 2.5 micrometers. In this embodiment, minimum sizes of the width of the first signal line 30, the width of the second signal line 40, the distance between two adjacent first signal lines 30, and the distance between the first signal line 30 and the second signal lines 40 are limited, so it is ensured that functions of the first signal line 30 and the second signal line 40 are normal without short circuit, open circuit, and other problems. It should be noted that when the width of the first signal line 30, the width of the second signal line 40, the distance between two adjacent first signal lines 30, and the distance between the first signal line 30 and the adjacent second signal line 30 approach the limit size, a vertical distance from the short side to the long side of the fanout line module 23 becomes smaller. That is, the smaller the height of the fanout line module 23 is, the smaller the height of the fanout line module 23 is, which is conducive to reducing the border size of the display panel and achieving a narrower border.

Alternatively, in the second wiring area 232, there are the plurality of first signal line 30 and the plurality of second signal line 40. Each first signal line 30 is parallel to at least one second signal line 40. It should be understood that the distance between the second signal line 40 and the first signal line 30 that are parallel to each other is easier to maintain the limit size. Moreover, the computer can easily calculate the position feature of the second signal line 40 according to the position of the first signal line 30, thereby improving the setting accuracy of the second signal line 40, reducing the height of the fanout line module 23, and achieving the narrower border.

Figure 5:
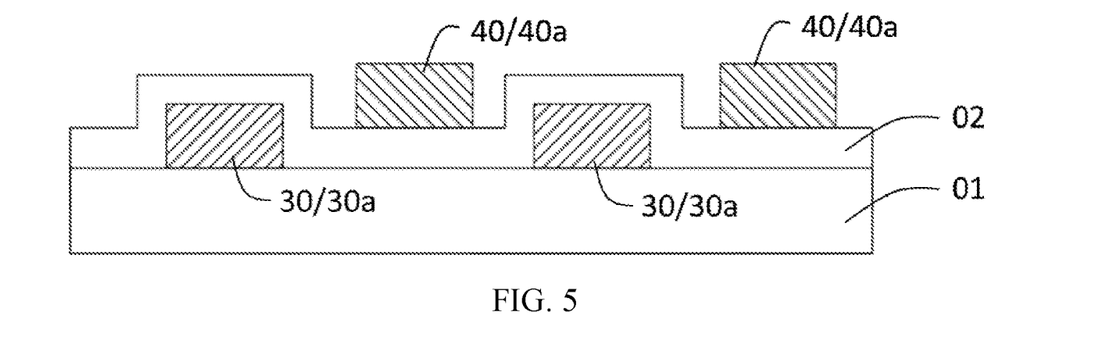
FIG. 5 is a cross-sectional view of the second wiring area shown in FIG. 2 along a line D-D'.

Alternatively, referring to FIG. 2 and FIG. 5, where FIG. 5 is a cross-sectional view of the second wiring area 232 shown in FIG. 2 along a line D-D'. The display panel also includes a substrate 01 disposed on a bottom layer. In the second wiring area 232, the first signal lines 30 are disposed on the substrate 01. An insulating layer 02 is also disposed on the substrate 01. The insulating layer 02 covers the first signal lines 30. The second signal lines 40 are disposed on the insulating layer 02, so that the first signal lines 30 and the second signal lines 40 are electrically insulated.

In conclusion, the display panel of the present disclosure includes the display area and the non-display area disposed on one side of the display area. The driving chip and the fanout wiring area are disposed in the non-display area. The first signal line connected to the data line and the second signal line connected to the gate line are disposed in the non-display area, which is beneficial to achieve narrow borders or no borders on three-side borders of the display panel. Moreover, the fanout line module is divided, it facilitates an arrangement of the first signal lines and the second signal lines in a state approaching the design limit, further reducing the border of the display panel.

Figure 6:
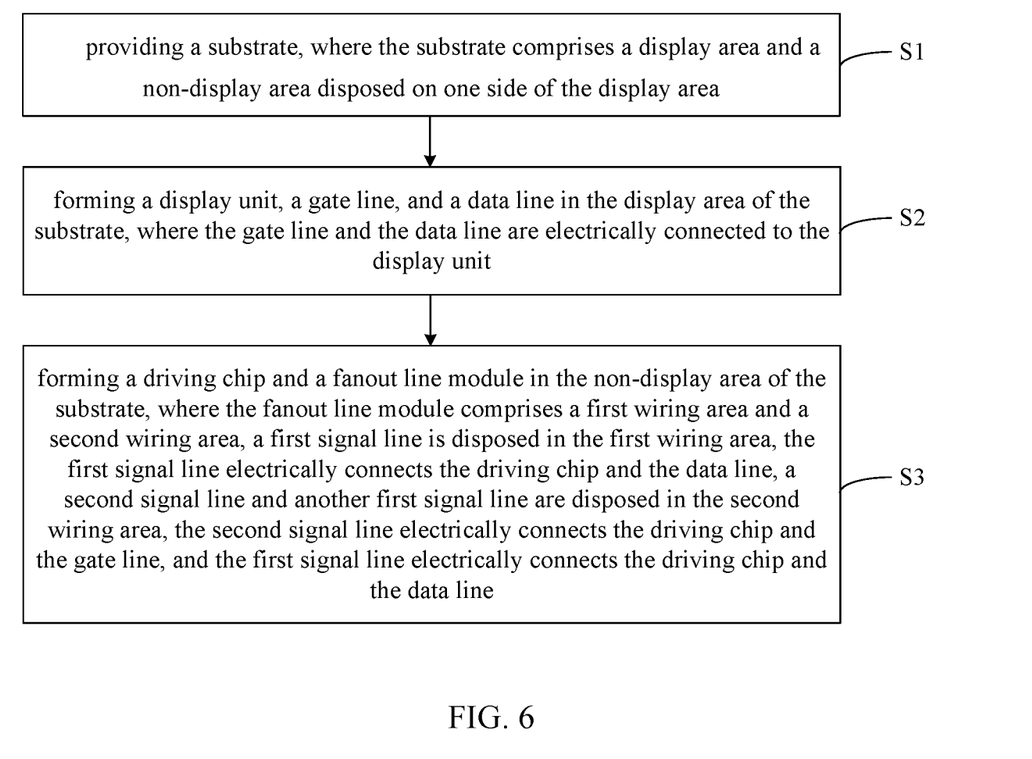
FIG. 6 is a flowchart of a manufacturing method of a display panel of an embodiment of the present disclosure.

As shown in FIG. 6, an embodiment of the present disclosure also provides a manufacturing method of a display panel. Referring to FIG. 1 to FIG. 5, the manufacturing method of the display panel includes the following steps.

In a step S1, a substrate 01 is provided. The substrate 01 includes a display area 10 and a non-display area 20 disposed on one side of the display area 10. It should be noted that the display area 10 is configured to set various elements that realize display functions of the display panel, such as display units, pixel units, driving units, etc., and the display area 10 is an effective display area of the display panel. The non-display area 20 is configured to set peripheral wiring, components, control chips, etc., and this area does not have a display function.

In a step S2, a display unit, a gate line 12, and a data line 11 are formed in the display area of the substrate. The gate line 12 and the data line 11 are electrically connected to the display unit. The data line 11 and the gate line 12 are configured to provide data signals and control signals to the display unit, so as to control a light-emitting display function of the display unit.

Specifically, the display area 10 is also provided with a plurality of thin film transistors. The data line 11 and the gate line 12 are electrically connected to a source and a gate of the thin film transistor, respectively. A drain of the thin film transistor is electrically connected to the display unit. It should be noted that the display unit is the most basic light-emitting display element in the display panel. The display unit may be a liquid crystal display unit composed of a single pixel electrode, a common electrode, and a liquid crystal controlled by the pixel electrode and the common electrode. The display unit may also be a single organic light-emitting diode display unit.

In a step S3, a driving chip 21 and a fanout line module 23 are formed in the non-display area 20 of the substrate 01. The fanout line module 23 includes a first wiring area 231 and a second wiring area 232. A first signal line 30 is disposed in the first wiring area 231, the first signal line 30 electrically connects the driving chip 21 and the data line 11. A second signal line 40 and another first signal line 30 are disposed in the second wiring area 232, the second signal line 40 electrically connects the driving chip 21 and the gate line 12, and the first signal line 30 electrically connects the driving chip 21 and the data line 11.

Specifically, the method of forming the fanout line module 23 includes the following steps.

The non-display area 20 of the substrate 01 are divided into the first wiring area 231 and the second wiring area 232. Alternatively, the first wiring area 231 includes a first region 2311 and a second region 2312, and the first region 2311 and the second region 2312 are located on both sides of the second wiring area 232, respectively.

A first metal layer 30a is formed on the substrate 01 in the first wiring area 231 and the second wiring area 232. Alternatively, the method for manufacturing the first metal layer 30a may be a physical deposition method or a spraying method.

The first metal layer 30a is patterned to form the first signal lines 30. Alternatively, the step of patterning the first metal layer 30a include exposure, development, and etching processes.

An insulating layer 02 covering the first signal line 30 is formed. Alternatively, the insulating layer 02 may be made of silicon oxide or silicon nitride ceramics, and the method of manufacturing the insulating layer 02 may be a chemical vapor deposition method or a spraying method.

A second metal layer 40a is formed on the insulating layer 02 in the second wiring area 232. Alternatively, the method for manufacturing the second metal layer 40a may be a physical deposition method or a spraying method.

The second metal layer 40a is patterned to form the second signal line 40. Alternatively, the step of patterning the second metal layer 40a include exposure, development, and etching processes.

Furthermore, before patterning the first metal layer 30a and the second metal layer 40a, the following steps need to be performed with a computer device.

A minimum line width L1 and a minimum line distance S1 of the first signal line 30 to be formed in the first wiring area 231 are input into the computer. Also, a minimum line width L1 of the first signal line 30 to be formed in the second wiring area 232, a minimum line width L2 of the second signal line 40, and a minimum line distance S2 between the first signal line 30 and the adjacent second signal line 40 are input into the computer. Alternatively, the minimum width L1 of the first signal line 30 is set to 3 micrometers, and the minimum width L2 of the second signal line 40 is set to 3 micrometers. In the first wiring area 231, the minimum distance S1 between two adjacent first signal lines 30 is set to 2.5 micrometers. In the second wiring area 232, the minimum distance S2 between the first signal line 30 and the adjacent second signal line 40 is set to 2.5 micrometers. It should be noted that under the above-mentioned limit value conditions, functions of the first signal line 30 and the second signal line 40 are normal without short circuit, open circuit, and other problems.

The computer calculates a position and a line width of the first signal line 30 in the first wiring area 231, and positions and line widths of the first signal line 30 and the second signal line 40 in the second wiring area 232. It should be noted that in this embodiment, the fanout line module 23 is divided into the first wiring area 231 and the second wiring area 232. Only the first signal lines 30 are provided in the first wiring area 231. The first signal lines 30 and the second signal lines 40 are together disposed in the second wiring area 232. Thus, the position and size characteristics of each signal line in the fanout line module 23 are refined. This is beneficial for the computer to accurately calculate the signal line setting information that is closer to the design limit, so that the final formed first signal line 30 and the second signal line 40 approach the design limit. Also, when the line widths and positions of the first signal line 30 and the second signal line 40 are approaching the design limit, the smaller the height of the fanout line module 23 is, the more beneficial it is to further reduce the border of the display panel.

According to the calculation result of the computer, the first metal layer 30a and the second metal layer 40a are patterned to form the first signal lines 30a and the second signal lines 40a, respectively.

In summary, in the manufacturing method of the display panel of the embodiment of the present disclosure, the first signal lines and the second signal lines are disposed in the non-display area on the same side of the display panel, which in turn facilitates narrowing or non-bordering of three-sided borders of the display panel. In addition, before forming the first signal lines and the second signal lines, the fanout line module is divided. The computer can more easily calculate the sizes and positions of the first signal lines and the second signal lines that are approaching the design limit based on signal line size characteristics in each area, which is beneficial to further reduce the border of the display panel.

Although embodiments of present disclosure have been shown and described above, above embodiments cannot be construed to limit the present disclosure, for those skilled in the art, changes and modifications can be made to the embodiments without departing from spirit and scope of the present disclosure. Accordingly, the scope of the invention shall be determined by the appended claims.

What is claimed is:

1. A display panel, having a display area and a non-display area disposed on one side of the display area, wherein a plurality of data lines and a plurality of gate lines are disposed in the display area, and a driving chip and a fanout wiring area are disposed in the non-display area;
    wherein at least one fanout line module is disposed in the fanout wiring area, the fanout line module has a first wiring area and a second wiring area, and the fanout line module comprises a plurality of first signal lines and one or more second signal lines, the first signal lines comprising a first set of first signal lines and a second set of first signal lines,
    the first set of first signal lines is disposed in the first wiring area and electrically connects the driving chip to a first part of the data lines,
    the second signal lines and the second set of first signal lines are disposed in the second wiring area, the second signal lines electrically connect the driving chip to the gate lines, and the second set of first signal lines electrically connects the driving chip to a second part of the data lines.

2. The display panel as claimed in claim 1, wherein in the second wiring area, the second set of first signal lines and the second signal lines are electrically insulated.

3. The display panel as claimed in claim 2, wherein an insulating layer is disposed between the second set of first signal lines and the second signal lines.

4. The display panel as claimed in claim 3, further comprising a substrate disposed on a bottom layer, wherein in the second wiring area, the second set of first signal lines is disposed on the substrate.

5. The display panel as claimed in claim 2, wherein in the second wiring area, at least one of the second signal lines is parallel to at least one of the second set of the first signal lines.

6. The display panel as claimed in claim 1, wherein the first wiring area has a first region and a second region, and the first region and the second region are respectively disposed on both sides of the second wiring area.

7. The display panel as claimed in claim 1, wherein each of the first signal lines and the second signal lines has a width greater than or equal to 3 micrometers.

8. The display panel as claimed in claim 1, wherein in the first wiring area, a distance between two adjacent ones of the first set of first signal lines is greater than or equal to 2.5 micrometers.

9. The display panel as claimed in claim 8, wherein in the second wiring area, each of the second signal lines is disposed between two adjacent ones of the second set of first signal lines, and a distance between each of the two adjacent ones and the each of the second signal lines is greater than or equal to 2.5 micrometers.

10. A manufacturing method of a display panel, comprising:
    providing a substrate, wherein the substrate has a display area and a non-display area disposed on one side of the display area;
    forming a display unit, a plurality of gate lines, and a plurality of data lines in the display area of the substrate, wherein the gate lines and the data lines are electrically connected to the display unit; and
    forming a driving chip and a fanout line module in the non-display area of the substrate,
        wherein the fanout line module has a first wiring area and a second wiring area, and the fanout line module comprises a plurality of first signal lines and one or more second signal lines, the first signal lines comprising a first set of first signal lines and a second set of first signal lines,
        the first set of first signal lines is disposed in the first wiring area and electrically connects the driving chip to a first part of the data lines,
        the second signal lines and the second set of first signal lines are disposed in the second wiring area, the second signal lines electrically connect the driving chip to the gate lines, and the second set of first signal lines electrically connects the driving chip to a second part of the data lines.

11. The manufacturing method of the display panel as claimed in claim 10, wherein the forming of the fanout line module comprises:
    defining the first wiring area and the second wiring area in the non-display area of the substrate;
    forming a first metal layer on the substrate in the first wiring area and the second wiring area;
    patterning the first metal layer to form the first signal lines;
    forming an insulating layer covering the first signal lines;
    forming a second metal layer on the insulating layer in the second wiring area; and
    patterning the second metal layer to form the second signal lines.

12. The manufacturing method of the display panel as claimed in claim 11, wherein the patterning of the first metal layer and the patterning of the second metal comprise:
    inputting a minimum line width and a minimum line distance of the first set of first signal lines to be formed in the first wiring area into a computer, and inputting a minimum line width of the second set of first signal lines to be formed in the second wiring area, a minimum line width of the second signal lines to be formed in the second wiring area, and a minimum line distance between each of the second signal lines and one of the second set of first signal lines adjacent to the each of the second signal lines into the computer;

calculating, by the computer, positions and line widths of the first set of first signal lines in the first wiring area, and positions and line widths of the second set of first signal lines and the second signal lines in the second wiring area; and patterning the first metal layer and the second metal layer according to a calculation result of the computer.

13. The manufacturing method of the display panel as claimed in claim 10, further comprising forming a plurality of thin film transistors in the display area, wherein each of the data lines and each of the gate lines are respectively electrically connected to a source and a gate of one of the thin film transistors, and a drain of the one of the thin film transistors is electrically connected to the display unit.

14. The manufacturing method of the display panel as claimed in claim 11, wherein the first wiring area has a first region and a second region, and the first region and the second region are respectively disposed on both sides of the second wiring area.

15. The manufacturing method of the display panel as claimed in claim 11, wherein the first metal layer and the second metal layer are formed by a physical deposition or spraying.

16. The manufacturing method of the display panel as claimed in claim 11, wherein the patterning of each of the first metal layer and the second metal layer comprises exposure, development, and etching processes.

17. The manufacturing method of the display panel as claimed in claim 10, wherein the second set of first signal lines and the second signal line are electrically insulated.

18. The manufacturing method of the display panel as claimed in claim 10, wherein each of the first signal lines and the second signal lines has a width greater than or equal to 3 micrometers.

19. The manufacturing method of the display panel as claimed in claim 10, wherein:

in the first wiring area, a distance between two adjacent ones of the first set of first signal lines is greater than or equal to 2.5 micrometers; and in the second wiring area, each of the second signal lines is disposed between two adjacent ones of the second set of first signal lines, and a distance between each of the two adjacent ones and the each of the second signal lines is greater than or equal to 2.5 micrometers.

20. A display panel, having a display area and a non-display area disposed on one side of the display area, wherein a plurality of data lines and a plurality of gate lines are disposed in the display area, and a driving chip and a fanout wiring area are disposed in the non-display area;

wherein at least one fanout line module is disposed in the fanout wiring area, the fanout line module has a first wiring area and a second wiring area, and the fanout line module comprises a plurality of first signal lines and a plurality of second signal lines, the first signal lines comprising a first set of first signal lines and a second set of first signal lines, the first set of first signal lines is are disposed in the first wiring area and electrically connects the driving chip to a first part of the data lines, the second signal lines and the second set of first signal lines are disposed in the second wiring area, the second signal lines electrically connect the driving chip to the gate lines, the second set of first signal lines electrically connects the driving chip to a second part of the data lines, and the second set of first signal lines and the second signal lines are electrically insulated;

wherein each of the first signal lines and the second signal lines has a width greater than or equal to 3 micrometers;

wherein in the first wiring area, a distance between two adjacent ones of the first set of first signal lines is greater than or equal to 2.5 micrometers; and wherein in the second wiring area, each of the second signal lines is disposed between two adjacent ones of the second set of first signal lines, and a distance between each of the two adjacent ones and the each of the second signal lines is greater than or equal to 2.5 micrometers.

* * * * *